United States Patent
Lee et al.

(10) Patent No.: US 6,740,994 B2
(45) Date of Patent: May 25, 2004

(54) ELECTRICAL BUS POWERED COOLING FAN

(75) Inventors: Gregory B Lee, Elgin, SC (US); Jerome Mark Visocky, Murfreesboro, TN (US); Janette Noack Chapman, Shelbyville, TN (US); Mark Daniel Hicks, Auburntown, TN (US)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 09/748,055

(22) Filed: Dec. 22, 2000

(65) Prior Publication Data

US 2002/0080564 A1 Jun. 27, 2002

(51) Int. Cl.[7] .............................. H02K 3/32; H02K 3/28
(52) U.S. Cl. .................... 310/63; 310/166; 310/180; 310/201; 417/356; 417/423.7; 361/678
(58) Field of Search ................ 310/62, 63, 1, 310/159, 166, 180, 201; 417/356, 410.1, 423.1, 423.7; 361/676, 678

(56) References Cited

U.S. PATENT DOCUMENTS

| 1,242,493 | A | * | 10/1917 | Stringham | 310/86 |
| 1,420,774 | A | * | 6/1922 | Stainbrook | 310/104 |
| 1,996,195 | A | * | 4/1935 | Ferguson | 310/63 |
| 1,996,460 | A | * | 4/1935 | Coates | 310/62 |
| 2,697,986 | A | * | 12/1954 | Meagher, Jr. | 310/86 |
| 4,962,734 | A | * | 10/1990 | Jorgensen | 123/41.49 |
| 6,309,190 | B1 | * | 10/2001 | Chen | 417/423.1 |
| 6,621,700 | B1 | * | 9/2003 | Roman et al. | 361/697 |

FOREIGN PATENT DOCUMENTS

| JP | 61-190196 | * | 8/1986 | H02K/17/10 |
| JP | 05-328646 | * | 12/1993 | H02K/3/04 |

* cited by examiner

Primary Examiner—Karl Tamai
(74) Attorney, Agent, or Firm—David R. Stacey

(57) ABSTRACT

A bus cooling fan that operates without an external electrical power supply. The fan is positioned proximate two bus bars of a polyphase electrical system. The fan includes a rotor supporting fan blades and mounted on an axle. The axle is supported by cross-braces in a shroud surrounding the rotor. The shroud is open at the ends. The fan is fabricated of non-ferrous, non-conducting material with the exception of the rotor. The bent rods which interact with the electromagnetic field created by the current-carrying bus bars of the polyphase electrical system to make the rotor function as an induction motor when the fan is placed proximate two bus bars.

20 Claims, 2 Drawing Sheets

ELECTRICAL BUS POWERED COOLING FAN

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of Invention

This invention pertains to cooling systems for electrical panels. More particularly, this invention pertains to a bus cooling fan that is powered from the electromagnetic field generated by an electrical bus and that does not require external electrical connections.

2. Description of the Related Art

Electrical panels, such as switchboards and switchgear, are used in electrical power distribution systems. These panels typically contain circuit breakers, transformers, and instrumentation. The electrical connections between these internal components are made with bus bars, with one bus bar for each phase of the polyphase electrical system and another bus bar for the neutral conductor, if there is one. The current flowing in many electrical power distribution systems is oftentimes high, resulting in heating of the bus bars and other components in the electrical panels. It is common to cool these components with an externally powered, electric cooling fan, which forces air to circulate through the panel. Using an externally powered, electric cooling fan necessitates an external power source and wiring.

Externally powered, electric cooling fans are typically driven by single-phase induction motors. These motors typically have a wound stator and a squirrel cage rotor, which rotates and drives the fan blades. Single-phase induction motors require some means of applying torque to the rotor in order to overcome inertia and start rotating. Various methods are known for starting single-phase induction motors. For example, the stator may use a shaded pole, where one-half of each pole is surrounded by a short-circuited winding called a shading coil. Another example is a split-phase motor, where the stator has two windings, one of which is an auxiliary winding which has an out-of-phase current relative to the other winding. A capacitor can be wired in series with the auxiliary winding of the split-phase motor. If used, the capacitor can be switched out of the circuit after the motor reaches a certain speed, or the capacitor can be left in the circuit and used to improve the motor's power factor.

BRIEF SUMMARY OF THE INVENTION

According to one embodiment of the present invention, a cooling fan without external electrical connections, provides cooling for polyphase bus bars in an electrical panel. The cooling fan operates as an induction motor in which the fan blade supports act as a rotor and the bus bars act as a stator.

BRIEF DESCRIPTION OF THE SEVERAL VIEWS OF THE DRAWINGS

The above-mentioned features of the invention will become more clearly understood from the following detailed description of the invention read together with the drawings in which.

DETAILED DESCRIPTION OF THE INVENTION

A bus cooling fan that operates without an external electrical power supply is disclosed. The fan draws its rotational energy from a rotating electromagnetic field produced by the current-carrying bus bars of a polyphase electrical system inside an electrical panel.

Figure 1:
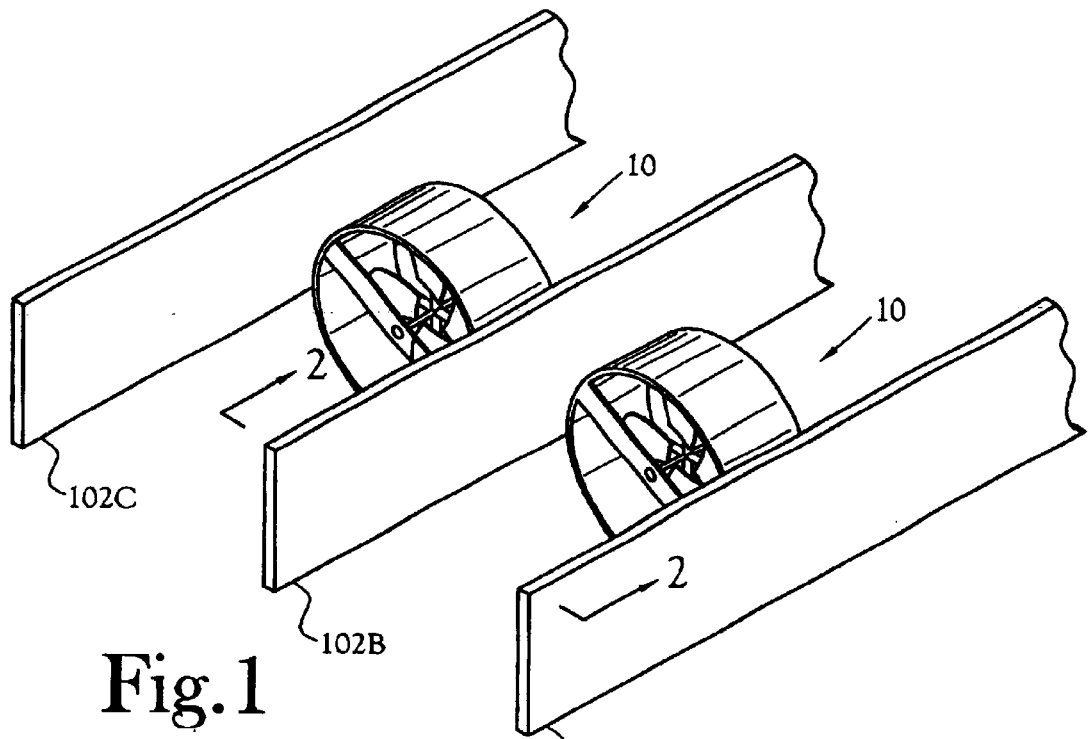
FIG. 1 is a perspective view of an electrical, three-phase bus with two bus cooling fans constructed in accordance with the present invention.

FIG. 1 shows a perspective view of bus cooling fans 10, constructed in accordance with the present invention, mounted adjacent to and between parallel bus bars 102 of a three-phase electrical power bus, such as would be utilized inside an electrical cabinet. It is well known that a magnetic field is generated around a current carrying conductor such that the direction of the magnetic flux is determined by the direction of current flowing in the conductor (right hand rule of magnetism). It is also well known that the instantaneous strength of the magnetic field is proportional to the amount of instantaneous current flowing in the conductor. In an AC power system the strength of the magnetic field at a particular point along the conductor varies with the sinusoidal current cycle as current passes the particular point. In a three-phase system of parallel bus bars 102 as shown, the peak current flowing through bus bar 102A, at any particular instant in time, is 120 degrees out of phase with the peak current flowing in bus bar 102B and 240 degrees out of phase with the peak current flowing in bus bar 102C. Therefore, at an arbitrary point in a plane perpendicular to the parallel bus bars 102, and the current flowing in them, the vector of the localized magnetic field at the arbitrary point will tend to rotate as the sinusoidal current in each electrical phase passes through the plane. The fan 10 is positioned in a plane generally perpendicular to the parallel bus bars 102 so as to force air along the longitudinal axis of the bus bars 102. Those skilled in the art will recognize that the fans 10 may be individually located anywhere along the run of bus bars 102 without departing from the spirit and scope of the invention.

Figure 2:
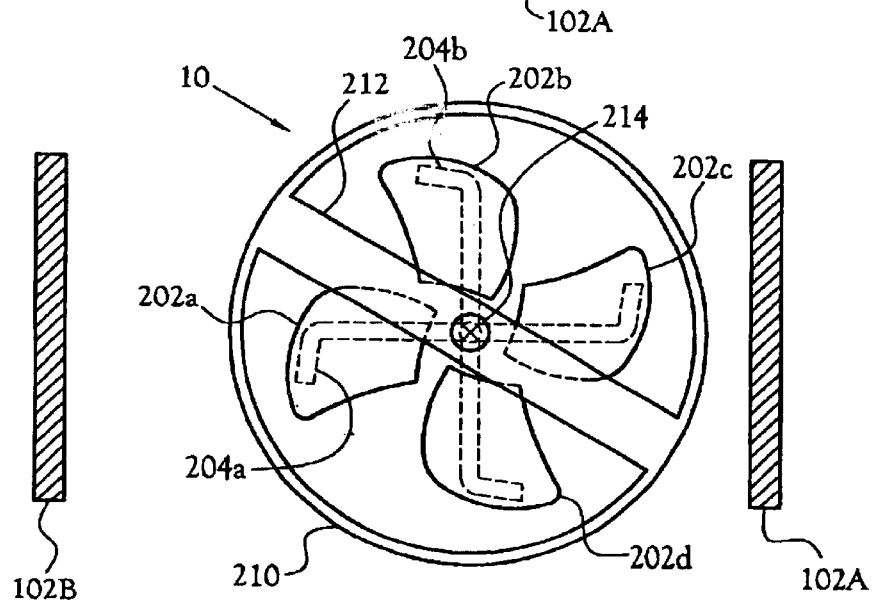
FIG. 2 illustrates a section view of two bus bars of the three-phase bus showing an end view of a bus cooling fan.

FIG. 2 illustrates a section view of two bus bars 102A, 102B with the bus cooling fan 10 situated between them. The center-point of the fan 10 is located at a position other than the midpoint between the bus bars 102. As illustrated, the fan 10 is positioned nearer the first bus bar 102A than the second bus bar 102A. The fan 10, as illustrated, has four fan blades 202a, 202b, 202c and 202d, which, when rotated about an axle 214, force air through a shroud 210. The shroud 210 has front and back cross-members 212 which provide support for the axle 214. The blades 202 are mounted to the axle 214 by bent rods 204a, 204b. Those skilled in the art will recognize that the rods 204 serve as a rotor of an induction motor and that the rod configuration and shape may vary without departing from the spirit and scope of the present invention. The illustrated embodiment does not show the mounting of the shroud 210 to the bus bar 102A; however, this can be accomplished through conventional means for fastening attachments to bus bars. Those skilled in the art will recognize that, alternatively, the shroud 210 can be attached to another support member, not shown, instead of attaching it to a bus bar without departing from the spirit and scope of the present invention.

Figure 3:
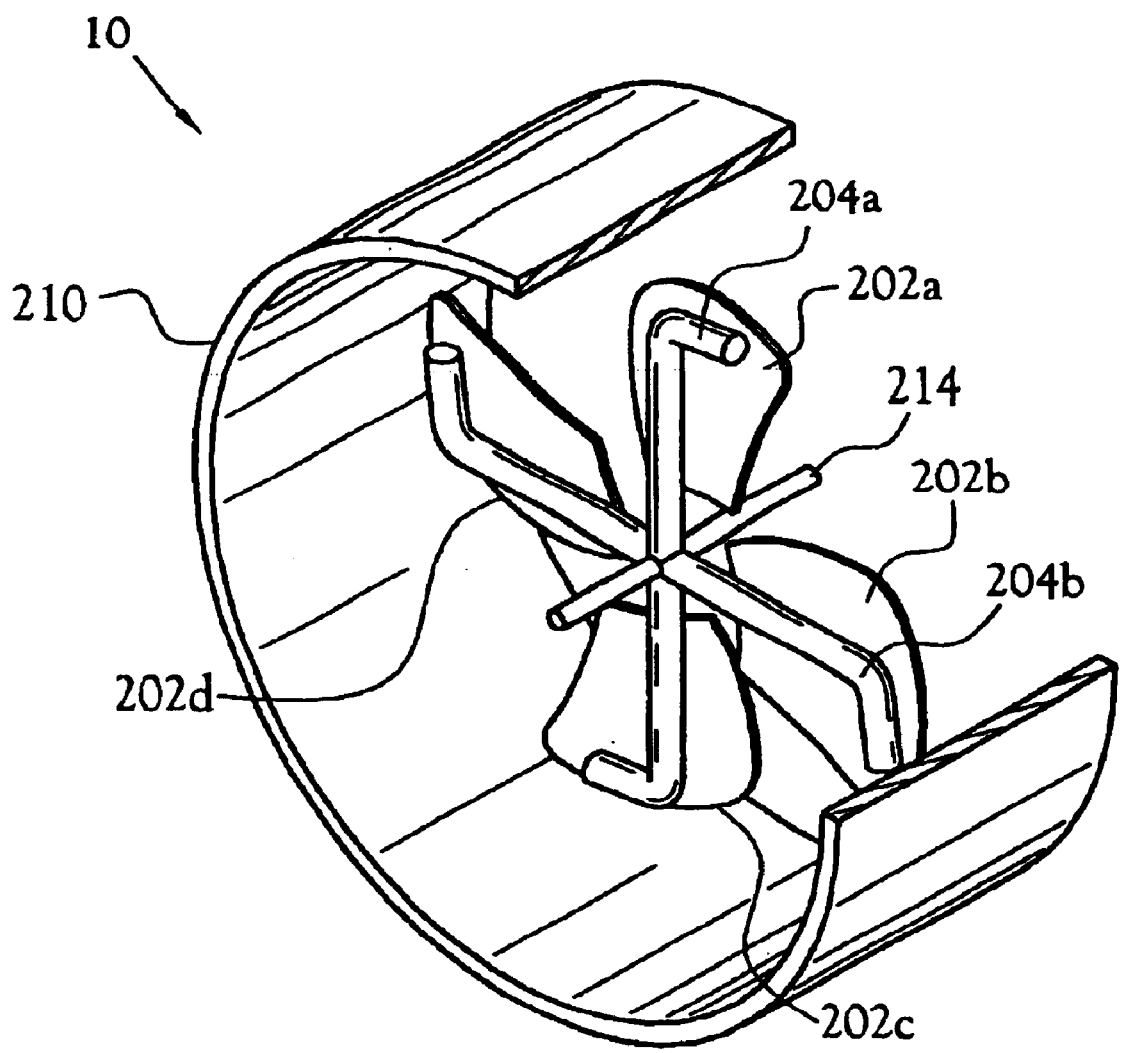
FIG. 3 is a perspective view of the bus cooling fan viewed from the opposite end from that illustrated in FIG. 2.

FIG. 3 shows a rear, perspective view of the bus cooling fan 10 with a portion of the shroud 210 shown cut-away, exposing the fan blades 202, the bent rods 204, and the central portion of the axle 214. In the illustrated embodiment, the shroud 210, the front and back cross-members 212 (shown in FIG. 2), the fan blades 202, the axle 214, and conventional bearings (not shown) for rotationally securing the axle 214 to the front and back cross-members 212 are fabricated of non-ferrous, non-conducting, and non-magnetic material. In the illustrated embodiment, the bent rods 204 are fabricated of a ferrous, conducting material. Those skilled in the art will recognize that the materials used to fabricate the various components of the cooling fan 10 may vary without departing from the spirit and scope of the present invention.

The cooling fan 10 performs similar to an induction motor when placed proximate two of the bus bars 102 of a polyphase electrical system. The bent rods 204, lying in the plane perpendicular to the bus bars 102, act as the rotor and the localized rotating magnet field produced by sinusoidal current flowing in the bus bars 102 functions as the stator of the induction motor. The bent rods 204 are inductively coupled to the bus bars 102 such that a counter-electromagnetic field with respect to that generated by the current-carrying bus bars 102 is established in the bent rods 204. The counter-electromagnetic field in the rods 204 continuously tries to align itself with the rotating magnetic field produced by the bus bars 102, thereby causing the rotor to rotate about the axle 214. By placing the center of rotation of the fan 10 slightly off-center in the space between the bus bars 102, the rotor 204 develops enough starting torque to begin rotation. The power requirements for the fan 10 to perform its cooling function are not great. Accordingly, the rotor need not be very efficient and the slip speed can be relatively high for an induction motor. Those skilled in the art will recognize that the shape of the bent rods 204 may vary without departing from the spirit and scope of the present invention. However, in the illustrated embodiment, each of the two bent rods 204a, 204b which define the rotor are substantially Z-shaped; that is,, the rods 204 are supported by the axle 214 in the center of the rod 204 and the rod 204 perpendicularly extends away from the axle 214 and the distal ends of each rod 204 are bent in a plane substantially perpendicular to the axle 214. It is also within the scope of the invention that the plurality of parallel bus bars 102 can be configured other than in a straight line and still produce the localized rotating magnetic field as described.

In operation, the cooling fan 10 rotational speed increases with increased current flow through the bus bars 102. As the current flow increases in the bus bars 102, so too does the heat generated by the bus bars 102, thus, the increase in rotational speed of the fan 10 further aids in cooling the bus bars 102. The shroud 210 directs the air flow from the fan 10 along the length of the bus bars 102. In the illustrated embodiment, the shroud 210 is cylindrical, but those skilled in the art will recognize that other shapes can be used to control the air flow without departing from the spirit and scope of the present invention.

From the forgoing description, it will be recognized by those skilled in the art that a bus cooling fan that operates without an external electrical power supply has been provided. This bus cooling fan circulates the air inside an electrical panel and is not dependant upon an external power source.

While one embodiment has been shown and described, it will be understood that it is not intended to limit the disclosure, but rather it is intended to cover all modifications and alternate methods falling within the spirit and the scope of the invention as defined in the appended claims.

Having thus described the aforementioned invention, we claim:

1. A bus cooling device for cooling a plurality of current-carrying bus bars of a polyphase electrical system that generate an electromagnetic field and positioned between a pair of the plurality of current-carrying bus bars, said bus cooling device comprising:
   a rotor responsive to the electromagnetic field generated by the plurality of bus bars of the polyphase electrical system;
   an axle rotationally connected to said rotor and defining a center of rotation;
   a mounting device configured to receive said axle and allow said axle to rotate therein.

2. The bus cooling device of claim 1 further comprising at least one fan blade attached to said rotor.

3. The bus cooling device of claim 1 wherein said center of rotation is disposed nearer one of said pair of bus bars than the other of said pair of bus bars.

4. The bus cooling device of claim 1 wherein said rotor has at least one rod, said at least one fan blade attached to said at least one rod.

5. The bus cooling device of claim 4 wherein said at least one rod is substantially perpendicular to said axle.

6. The bus cooling device of claim 4 wherein said at least one rod defines a substantially L-shape.

7. The bus cooling device of claim 1 further comprising a shroud surrounding said rotor and said at least one fan blade.

8. The bus cooling device of claim 7 wherein said shroud is composed of a substantially non-magnetic, substantially non-conducting material.

9. The bus cooling device of claim 7 wherein said shroud directs an air flow along a longitudinal axis substantially parallel to said pair of bus bars.

10. A bus cooling device for cooling a plurality of bus bars of a polyphase electrical system that generate an electromagnetic field and positioned between a pair of the plurality of bus bars, said bus cooling device comprising:
    means for interacting with an electromagnetic field generated by the plurality of bus bars of the polyphase electrical system;
    means for forcing an air flow;
    means for allowing rotation of said means for interacting; and
    means for supporting said means for allowing rotation.

11. The bus cooling device of claim 10 further comprising a means for rotationally starting said means for interacting.

12. The bus cooling device of claim 10 further comprising a means for directing said air flow.

13. A bus cooling device for cooling a plurality of generally parallel bus bars of a polyphase electrical system, said bus cooling device comprising:
    a rotor positioned in a plane perpendicular to the plurality of generally parallel bus bars and proximate a pair of the plurality of generally parallel bus bars, said rotor being responsive to a rotating electromagnetic field generated in said plane by the parallel bus bars of the polyphase electrical system;
    at least one fan blade attached to said rotor;
    an axle generally parallel to the parallel bus bars and rotationally connected to said rotor, said axle defining a center of rotation of said rotor;

a mounting device configured to receive said axle and allow said axle to rotate therein.

14. The bus cooling device of claim 13, wherein the center of rotation of said rotor is located at some arbitrary point other than a midpoint between any two adjacent parallel bus bars of the polyphase electrical system.

15. The bus cooling device of claim 14, wherein the localized electromagnetic field generated by the plurality of parallel bus bars of the polyphase electrical system at said arbitrary point tends to rotate causing a rotation of said rotor about said axle.

16. The bus cooling device of claim 13, wherein said rotor is made from a ferrous material.

17. A bus cooling device for cooling a plurality of generally parallel bus bars of a polyphase electrical system, said bus cooling device comprising:

a rotor positioned in a plane generally perpendicular to a longitudinal axis of the plurality of generally parallel bus bars and proximate a pair of the plurality of generally parallel bus bars, said rotor being responsive to an electromagnetic field generated in said plane by the parallel bus bars of the polyphase electrical system;

at least one fan blade attached to said rotor; an axle generally parallel to the parallel bus bars and connected to said rotor such that said axle defines a center of rotation of said rotor;

a mounting device configured to receive said axle and allow said axle to rotate therein.

18. The bus cooling device of claim 17, wherein the center of rotation of said rotor is located at some arbitrary point in said plane.

19. The bus cooling device of claim 18, wherein, the localized electromagnetic field generated by the plurality of parallel bus bars of the polyphase electrical system at said arbitrary point tends to rotate causing a rotation of said rotor.

20. The bus cooling device of claim 17, wherein said rotor is made from a ferrous material.

* * * * *